United States Patent
Wohlmuth et al.

(10) Patent No.: US 12,310,105 B2
(45) Date of Patent: May 20, 2025

(54) SEMICONDUCTOR DEVICE INCLUDING HIGH ELECTRON MOBILITY TRANSISTORS WITH AN IMPROVED BACKSIDE ELECTRODE BEING APPLIED IN A HALF-BRIDGE CIRCUIT

(71) Applicant: Vanguard International Semiconductor Corporation, Hsinchu (TW)

(72) Inventors: Walter Wohlmuth, Taipei (TW); Shin-Cheng Lin, Hsinchu County (TW); Chia-Ching Huang, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 640 days.

(21) Appl. No.: 17/684,438

(22) Filed: Mar. 2, 2022

(65) Prior Publication Data
US 2023/0282645 A1    Sep. 7, 2023

(51) Int. Cl.
*H10D 86/00*    (2025.01)
*H01L 23/02*    (2006.01)
(Continued)

(52) U.S. Cl.
CPC .......... *H10D 86/201* (2025.01); *H01L 23/02* (2013.01); *H10D 30/475* (2025.01); *H10D 62/824* (2025.01); *H10D 64/411* (2025.01)

(58) Field of Classification Search
CPC . H01L 27/1203; H01L 29/06; H01L 29/0603; H01L 29/66462; H01L 29/778;
(Continued)

(56) References Cited

U.S. PATENT DOCUMENTS

| | | | |
|---|---|---|---|
| 10,658,520 B2 | 5/2020 | Kimura | |
| 2012/0153300 A1* | 6/2012 | Lidow | H01L 29/7787 257/77 |

(Continued)

FOREIGN PATENT DOCUMENTS

| | | |
|---|---|---|
| EP | 2 824 700 A1 | 1/2015 |
| TW | I718330 B | 2/2021 |

*Primary Examiner* — Britt D Hanley
*Assistant Examiner* — Connor Lewis French
(74) *Attorney, Agent, or Firm* — Winston Hsu

(57) ABSTRACT

A semiconductor device includes an insulating layer, a semiconductor layer, and a compound semiconductor stacked layer disposed on a substrate in sequence, a first transistor, a second transistor, an isolation structure, and a conductive structure. The first transistor is disposed in a first device region and on the compound semiconductor stacked layer. The second transistor is disposed in a second device region and on the compound semiconductor stacked layer. The isolation structure is disposed between the first and second transistors. The conductive structure is disposed in the second device region, passes through the compound semiconductor stacked layer, and electrically connects the semiconductor layer to a second source of the second transistor. There is no electrical connection between the semiconductor layer in the first device region and a first source of the first transistor.

19 Claims, 6 Drawing Sheets

(51) Int. Cl.
*H10D 30/47* (2025.01)
*H10D 62/824* (2025.01)
*H10D 64/27* (2025.01)

(58) Field of Classification Search
CPC ... H01L 23/02; H01L 23/00; H01L 21/76283; H01L 21/76264; H01L 21/7624; H10D 62/00; H10D 62/343; H10D 62/17; H10D 62/854; H10D 62/8503; H10D 62/85; H10D 86/00; H10D 84/00; H10D 84/01; H10D 84/82; H10D 84/80; H10D 84/05; H10D 84/02; H10D 86/201; H10D 62/824; H10D 64/00; H10D 64/411; H10D 64/311
See application file for complete search history.

(56) References Cited

U.S. PATENT DOCUMENTS

| | | | |
|---|---|---|---|
| 2017/0148905 A1* | 5/2017 | Tipirneni | H01L 29/7786 |
| 2019/0288099 A1* | 9/2019 | Hebert | H01L 27/0605 |
| 2020/0203345 A1 | 6/2020 | Matsuzaki | |
| 2021/0296311 A1* | 9/2021 | Iwao | H01L 27/0605 |
| 2021/0384111 A1* | 12/2021 | Voss | H01L 23/49575 |
| 2022/0392887 A1* | 12/2022 | Yanagihara | H01L 27/0605 |
| 2023/0282710 A1* | 9/2023 | Buckley | H01L 27/0605 |
| | | | 257/194 |

\* cited by examiner

SEMICONDUCTOR DEVICE INCLUDING HIGH ELECTRON MOBILITY TRANSISTORS WITH AN IMPROVED BACKSIDE ELECTRODE BEING APPLIED IN A HALF-BRIDGE CIRCUIT

BACKGROUND OF THE INVENTION

1. Field of the Invention

The present disclosure relates generally to semiconductor devices, and more particularly to semiconductor devices including high electron mobility transistors.

2. Description of the Prior Art

In semiconductor technology, group III-V semiconductor compounds may be used to construct various integrated circuit (IC) devices, such as high power field-effect transistors (FETs), high frequency transistors, or high electron mobility transistors (HEMTs). A HEMT is a field effect transistor having a two dimensional electron gas (2-DEG) layer close to a junction between two materials with different energy gaps (i.e., a hetero-junction). The 2-DEG layer is used as the transistor channel instead of a doped region, as is generally the case for metal oxide semiconductor field effect transistors (MOSFETs). Compared with MOSFETs, HEMTs have a number of attractive properties, such as high electron mobility and the ability to transmit signals at high frequencies.

A half-bridge circuit is widely used in the field of power electronics. When a high-side switching element and a low-side switching element of a half-bridge circuit share the same substrate, they are easily affected by cross talk in series connection. Therefore, it is difficult to implement a half-bridge circuit in a system on a chip (SoC). HEMTs may be applied in a half-bridge circuit as the high-side switching element and the low-side switching element of the half-bridge circuit to achieve the benefits of SoC. However, when HEMTs are applied in a half-bridge circuit, there are still some problems that need to be overcome.

SUMMARY OF THE INVENTION

In view of this, the present disclosure provides a semiconductor device including high electron mobility transistors with an improved backside electrode to solve the problems of high electron mobility transistors being applied in a half-bridge circuit.

According to one embodiment of the present disclosure, a semiconductor device is provided and includes a substrate, an insulating layer, a semiconductor layer, a compound semiconductor stacked layer, a first transistor, a second transistor, an isolation structure, and a conductive structure. The insulating layer, the semiconductor layer and the compound semiconductor stacked layer are disposed on the substrate in sequence. The first transistor is disposed in a first device region and includes a first gate electrode, a first source electrode and a first drain electrode disposed on the compound semiconductor stacked layer. The second transistor is disposed in a second device region, and includes a second gate electrode, a second source electrode, and a second drain electrode disposed on the compound semiconductor stacked layer. The isolation structure is disposed between the first transistor and the second transistor. The conductive structure is disposed in the second device region, passes through the compound semiconductor stacked layer, and electrically connects the semiconductor layer to the second source electrode. There is no electrical connection between the semiconductor layer in the first device region and the first source electrode.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
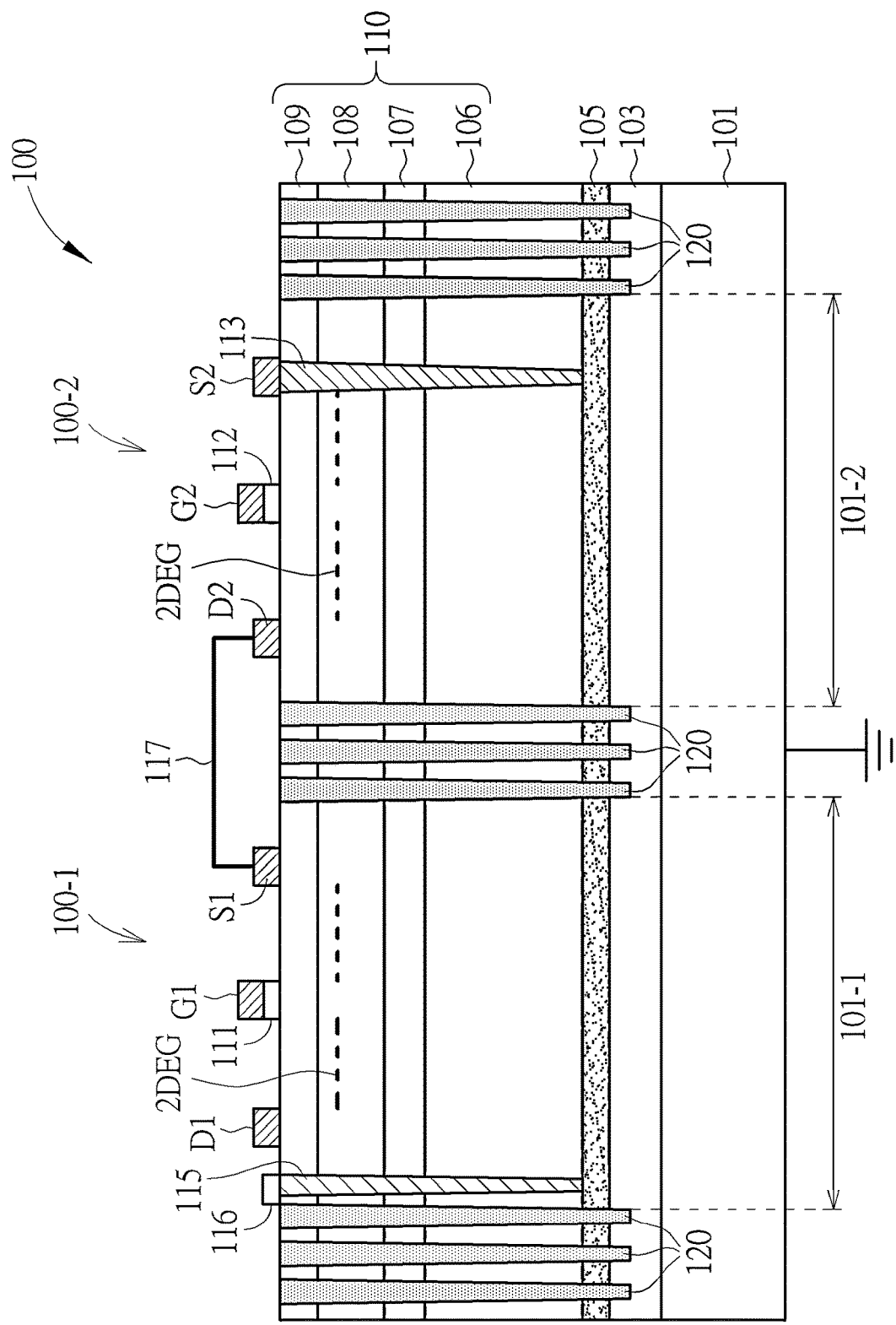
FIG. 1 is a schematic cross-sectional view of a semiconductor device according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, group III-V semiconductor may contain dopants to become semiconductor with specific conductivity type, such as n-type or p-type.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to a semiconductor device including high electron mobility transistors (HEMTs). The HEMTs may be used as a high voltage switching element (or referred to as a high-side switching element) and a low voltage switching element (or referred to as a low-side switching element) of a half-bridge circuit.

According to embodiments of the present disclosure, there is no electrical connection between the backside electrode and the source electrode of the HEMT for the high-side switching element. The backside electrode of the HEMT for the high-side switching element is electrically connected to a ground terminal, or the backside electrode of the HEMT for the high-side switching element is an electrically floating layer. Accordingly, there is no parasitic capacitance generated between the backside electrode of the high-side switching element and the substrate of the semiconductor device. Therefore, the embodiments of the present disclosure avoid the input/output voltage of the semiconductor devices being affected, and avoid the thickness between the backside electrode and the substrate of the semiconductor devices limiting the capability of power supply voltage (Vbus) of the devices.

FIG. 1 is a schematic cross-sectional view of a semiconductor device according to an embodiment of the present disclosure. As shown in FIG. 1, in one embodiment, a semiconductor device 100 includes a substrate 101, an insulating layer 103, a semiconductor layer 105, and a compound semiconductor stacked layer 110 that are disposed from bottom to top in sequence. According to some embodiments, the material of the substrate 101 may include ceramic, silicon carbide (SiC), aluminum nitride (AlN), sapphire or silicon. When the substrate 101 is made of a material with high hardness, high thermal conductivity, and low electrical conductivity, such as a ceramic substrate, it is more suitable for high-voltage semiconductor devices. The aforementioned high hardness, high thermal conductivity, and low electrical conductivity of the substrate are compared with a single-crystal silicon substrate, and the high-voltage semiconductor devices refer to semiconductor devices with an operating voltage higher than 50V. The material of the insulating layer 103 may include silicon oxide, silicon nitride, silicon oxynitride, or a combination thereof. The material of the semiconductor layer 105 may include silicon or polysilicon. In one embodiment, for example, the substrate 101 is silicon, the insulating layer 103 is silicon oxide, the semiconductor layer 105 is silicon, and the substrate 101, the insulating layer 103 and the semiconductor layer 105 constitute a semiconductor-on-insulator (SOI) substrate, i.e., the substrate 101, the insulating layer 103 and the semiconductor layer 105 in an embodiment of the present disclosure may be provided by an SOI substrate. In another embodiment, the substrate 101, the insulating layer 103 and the semiconductor layer 105 may be provided by a composite substrate (or referred to as a QST substrate) composed of a core substrate wrapped around by a composite material layer. The core substrate includes ceramic, silicon carbide, aluminum nitride, sapphire or silicon. The composite material layer includes an insulating material layer and a semiconductor material layer, where the insulating material layer may be single or multiple layers of silicon oxide, silicon nitride or silicon oxynitride, and the semiconductor material layer may be silicon or polysilicon. In addition, during the fabrication of the semiconductor devices, the composite material layer on the backside of the core substrate is removed by a thinning process, such as a grinding or etching process, so that the backside of the core substrate is exposed. In some embodiments, the thickness of the insulating layer 103 may be in a range of about 1 micrometer ($\mu m$) to about 3 $\mu m$, for example, about 2 $\mu m$. The thickness of the semiconductor layer 105 may be in a range of about 5 nanometer (nm) to about 350 nm. The thickness of the semiconductor layer 105 may be moderately adjusted to avoid crack therein. In some embodiments, the substrate 101 is an insulating substrate, and its material includes ceramic, aluminum nitride or sapphire. In other embodiments, the substrate 101 is electrically connected to a ground terminal.

According to embodiments of the present disclosure, the compound semiconductor stacked layer 110 is disposed on the semiconductor layer 105 to form HEMTs. The compound semiconductor stacked layer 110 may be formed on the semiconductor layer 105 by epitaxial growth, and the semiconductor layer 105 may be used as a nucleation layer for the compound semiconductor stacked layer 110. According to some embodiments, the compound semiconductor stacked layer 110 may include a buffer layer 106, a high resistance layer (or referred to as an electrical isolation layer) 107, a channel layer 108, and a barrier layer 109 that are stacked on the semiconductor layer 105 from bottom to top in sequence. The material of each layer of the compound semiconductor stacked layer 110 includes group III-V compound semiconductors (also referred to as group III-V semiconductors). In one embodiment, the buffer layer 106 may be a superlattice (SL) structure, for example, including a plurality of alternately stacked aluminum gallium nitride (AlGaN) layers and aluminum nitride (AlN) layers. The high resistance layer 107 may be, for example, a carbon-doped gallium nitride (c-GaN) layer. The channel layer 108 may be, for example, an undoped gallium nitride (u-GaN) layer. The barrier layer 109 may be, for example, an aluminum gallium nitride (AlGaN) layer, but not limited thereto. In addition, the compound semiconductor stacked layer 110 may further include other layers, such as an epitaxial layer (for example, AlN) for reducing lattice defects. The epitaxial layer may be disposed between the buffer layer 106 and the semiconductor layer 105. The composition and the arrangement of each layer in the compound semiconductor stacked layer 110 may be determined according to the requirements of various semiconductor devices.

According to embodiments of the present disclosure, the semiconductor device 100 further includes a first transistor 100-1 and a second transistor 100-2. The first transistor 100-1 is disposed in a first device region 101-1, and includes a first gate electrode G1, a first source electrode S1 and a first drain electrode D1 disposed on the compound semiconductor stacked layer 110. The second transistor 100-2 is disposed in a second device region 101-2, and includes a second gate electrode G2, a second source electrode S2 and a second drain electrode D2 disposed on the compound semiconductor stacked layer 110. In addition, the first transistor 100-1 further includes a first cap layer 111 disposed between the first gate electrode G1 and the barrier layer 109. The second transistor 100-2 further includes a second cap layer 112 disposed between the second gate electrode G2 and the barrier layer 109. In one embodiment, the first cap layer 111 and the second cap layer 112 are, for example, p-type gallium nitride (p-GaN) layers, but not limited thereto. Since there is a discontinuous energy gap between the channel layer 108 and the barrier layer 109, by stacking the channel layer 108 and the barrier layer 109 on each other, electrons will be gathered at the hetero-junction between the channel layer 108 and the barrier layer 109 due to the piezoelectric effect, thereby producing a thin layer with high electron mobility, i.e., a two-dimensional electron gas region 2DEG. For normally off devices, when no voltage is applied to the first gate electrode G1 and the second gate electrode G2, a region covered by the first cap layer 111 and the second cap layer 112 will not form two-dimensional electron gas (as shown in FIG. 1), and the region may be regarded as a 2DEG cut-off region. At this time, there is no electrical conduction between the first source electrode S1 and the first drain electrode D1, and between the second source electrode S2 and the second drain electrode D2. When a positive voltage is applied to the first gate electrode G1 and the second gate electrode G2, the region covered by the first cap layer 111 and the second cap layer 112 will form a two-dimensional electron gas, so that a continuous two-dimensional electron gas region is generated between the first source electrode S1 and the first drain electrode D1, and between the second source electrode S2 and the second drain electrode D2. Thus, an electrical conduction between the first source electrode S1 and the first drain electrode D1, and an electrical conduction between the second source electrode S2 and the second drain electrodes D2 are achieved. In the embodiments of the present disclosure, both the first transistor 100-1 and the second transistor 100-2 are HEMTs.

In addition, the semiconductor device 100 further includes an isolation structure 120 disposed between the first transistor 100-1 and the second transistor 100-2. In some embodiments, the isolation structure 120 passes through the compound semiconductor stacked layer 110 and the semiconductor layer 105, and further extends downward to a position in the depth of the insulating layer 103. The bottom surface of the isolation structure 120 may be lower than the top surface of the insulating layer 103. A deep trench may be formed in the compound semiconductor stacked layer 110, the semiconductor layer 105 and the insulating layer 103 by etching, and then the deep trench is filled up with a dielectric material, such as silicon oxide, silicon nitride, or a combination thereof. Next, the aforementioned structure is subjected to a chemical mechanical planarization (CMP) process to form the isolation structure 120. In some embodiments, the isolation structure 120 may be a ring-shaped insulating pillar structure with one or more circles respectively surrounding the first transistor 100-1 and the second transistor 100-2. In the embodiments of the present disclosure, the semiconductor layer 105 may be used as the backside electrodes of the first transistor 100-1 and the second transistor 100-2, and the isolation structure 120 passing through the compound semiconductor stacked layer 110 and the semiconductor layer 105 provides good electrical isolation between the first transistor 100-1 and the second transistor 100-2.

Figure 2:
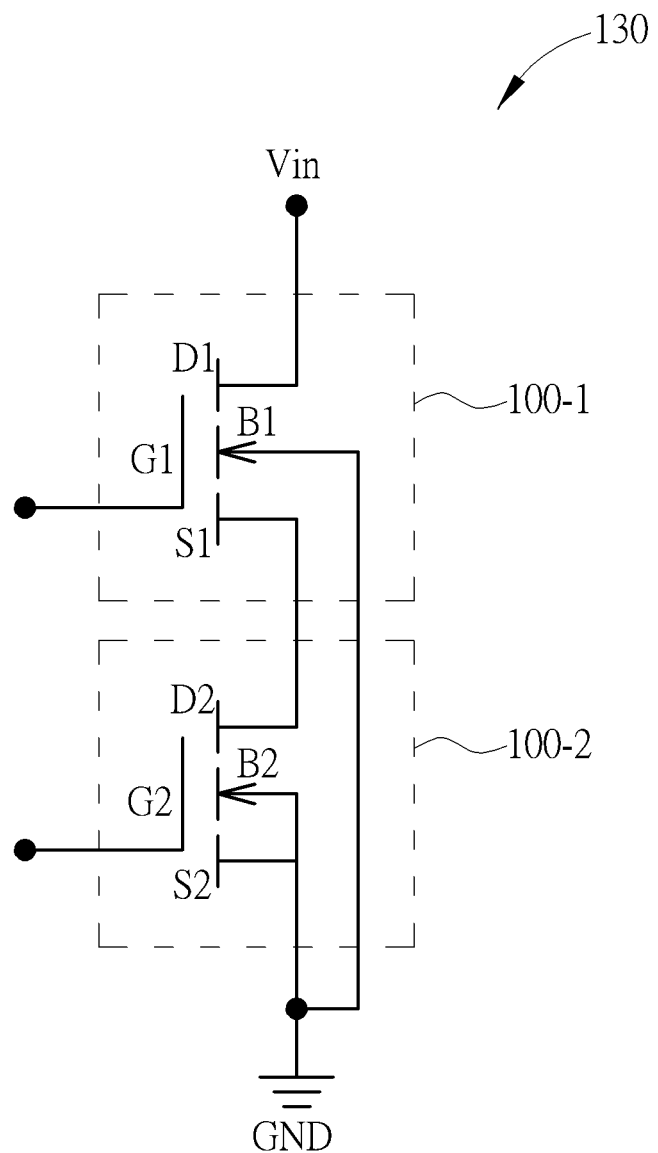
FIG. 2 is a half-bridge circuit according to an embodiment of the present disclosure.

FIG. 2 shows a half-bridge circuit 130 according to an embodiment of the present disclosure. As shown in FIG. 2, the first transistor 100-1 may be a high voltage switching element (or referred to as a high-side switching element) of the half-bridge circuit 130. The second transistor 100-2 may be a low-voltage switching element (or referred to as a low-side switching element) of the half-bridge circuit 130. The first drain electrode D1 of the high-side switching element is electrically connected to an input voltage node Vin. The second source electrode S2 of the low-side switching element is electrically connected to a ground terminal GND. The first source electrode S1 of the high-side switching element is electrically connected to the second drain electrode D2 of the low-side switching element, and may be further electrically connected to an output voltage node (not shown). Please refer to FIG. 1 and FIG. 2 together, the semiconductor device 100 further includes a conductive structure 113 disposed in the second device region 101-2. The conductive structure 113 passes through the compound semiconductor stacked layer 110 in the second device region 101-2, and electrically connects the semiconductor layer 105 in the second device region 101-2 to the second source electrode S2. Since the semiconductor layer 105 may be used as a backside electrode B1 of the first transistor 100-1 and a backside electrode B2 of the second transistor 100-2, the conductive structure 113 electrically connects the backside electrode B2 of the second transistor 100-2 (also referred to as the low-side switching element) to the second source electrode S2. Moreover, the second source electrode S2 of the low-side switching element is usually electrically connected to a ground node. Therefore, the backside electrode B2 of the second transistor 100-2 may be electrically grounded through the conductive structure 113 and the second source electrode S2.

In addition, according to the embodiments of the present disclosure, there is no electrical connection between the semiconductor layer 105 in the first device region 101-1 and the first source electrode S1, i.e., the backside electrode B1 of the first transistor 100-1 (also referred to as the high-side switching element) is not directly electrically connected to the first source electrode S1. There is no conductive structure passing through the compound semiconductor stacked layer 110 and being connected to the semiconductor layer 105 in the vertical projection area of the first source electrode S1. Since the first source electrode S1 of the high-side switching element is electrically connected to the second drain electrode D2 of the low-side switching element through an interconnection structure 117 and has the potential of an output voltage, and the semiconductor layer 105 in the first device region 101-1 of the embodiments of the present disclosure is not electrically connected to the first source electrode S1, so that the semiconductor layer 105 in the first device region 101-1 does not have the potential of the output voltage. Therefore, the embodiments of the present disclosure avoid the occurrence of a parasitic capacitance being generated between the semiconductor layer 105 in the first device region 101-1 and the substrate 101, which protects the input/output voltage of the semiconductor device 100 from being affected and maintains a normal operating voltage of the semiconductor device 100.

According to an embodiment of the present disclosure, please refer to FIG. 1 and FIG. 2 together, the semiconductor layer 105 in the first device region 101-1 (the backside electrode B1 of the high-side switching element) may be electrically connected to the ground terminal through another conductive structure 115 disposed outside the first gate electrode G1, the first source electrode S1 and the first drain electrode D1. As shown in FIG. 2, in one embodiment, the backside electrode B1 of the high-side switching element and the second sources S2 of the low-side switching element both are electrically connected to the same ground node. As shown in FIG. 1, in one embodiment, the another conductive structure 115 is disposed in an are other than the vertical projection areas of the first gate electrode G1, the first source S1 electrode and the first drain electrode D1. Moreover, the conductive structure 115 passes through the compound semiconductor stacked layer 110, and is electrically connected to the semiconductor layer 105. The conductive structure 115 may be electrically connected to the ground terminal through a conductive pad 116 disposed thereon, so that the backside electrode B1 of the high-side switching element is electrically connected to the ground terminal through the conductive structure 115, the conductive pad 116 and other connection structures.

Figure 3:
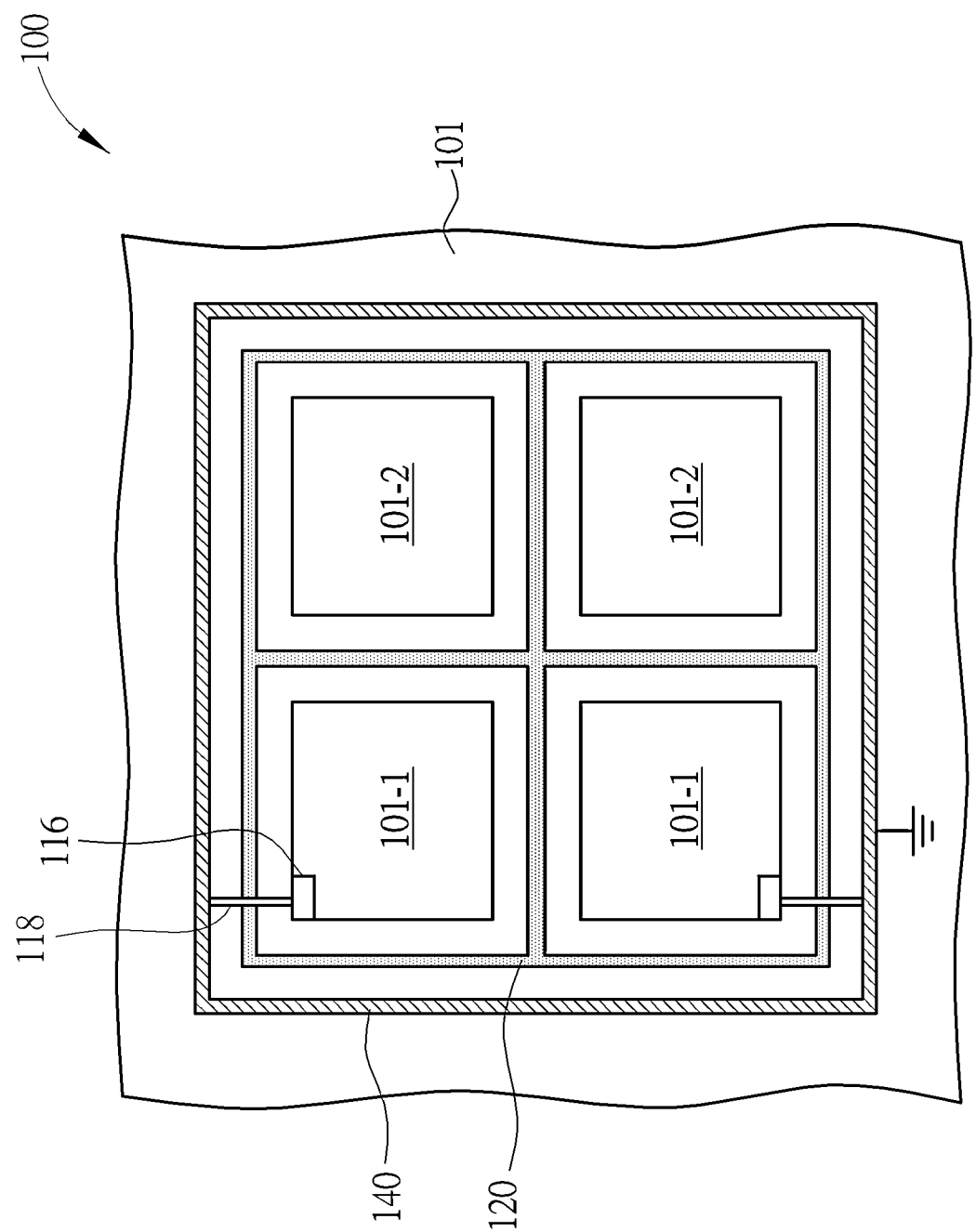
FIG. 3 is a schematic top view of a semiconductor device according to an embodiment of the present disclosure.

FIG. 3 is a schematic top view of a semiconductor device according to an embodiment of the present disclosure. As shown in FIG. 3, in one embodiment, the periphery of the first device region 101-1 and/or the second device region 101-2 is surrounded by a conductive seal ring 140. The conductive pad 116 in the first device region 101-1 may be electrically connected to the seal ring 140 through a wire 118, where the seal ring 140 is disposed at the periphery of the device region of the semiconductor device 100. The conductive pad 116 is further electrically connected to a ground terminal through the seal ring 140, so that the conductive structure 115 disposed under the conductive pad 116 in the first device region 101-1 is electrically connected to the ground terminal. Therefore, the semiconductor layer 105 in the first device region 101-1 is electrically grounded. The aforementioned wire 118 may be disposed in a dielectric layer (not shown) above the conductive pad 116, but not limited thereto. Although there are two first device regions 101-1 and two second device regions 101-2 surrounded by the seal ring 140 as shown in FIG. 3, in fact, there may be more device regions surrounded by the seal ring 140, and each device region is surrounded by the isolation structure 120. In one embodiment, the isolation structures 120 may be connected with each other to form a grid structure. In addition, the isolation structure 120 may be an insulating pillar structure surrounding the conductive structure 115 under the conductive pad 116, thereby avoiding an unnecessary electrical connection between the adjacent first device region 101-1 and the second device region 101-2.

Figure 4:
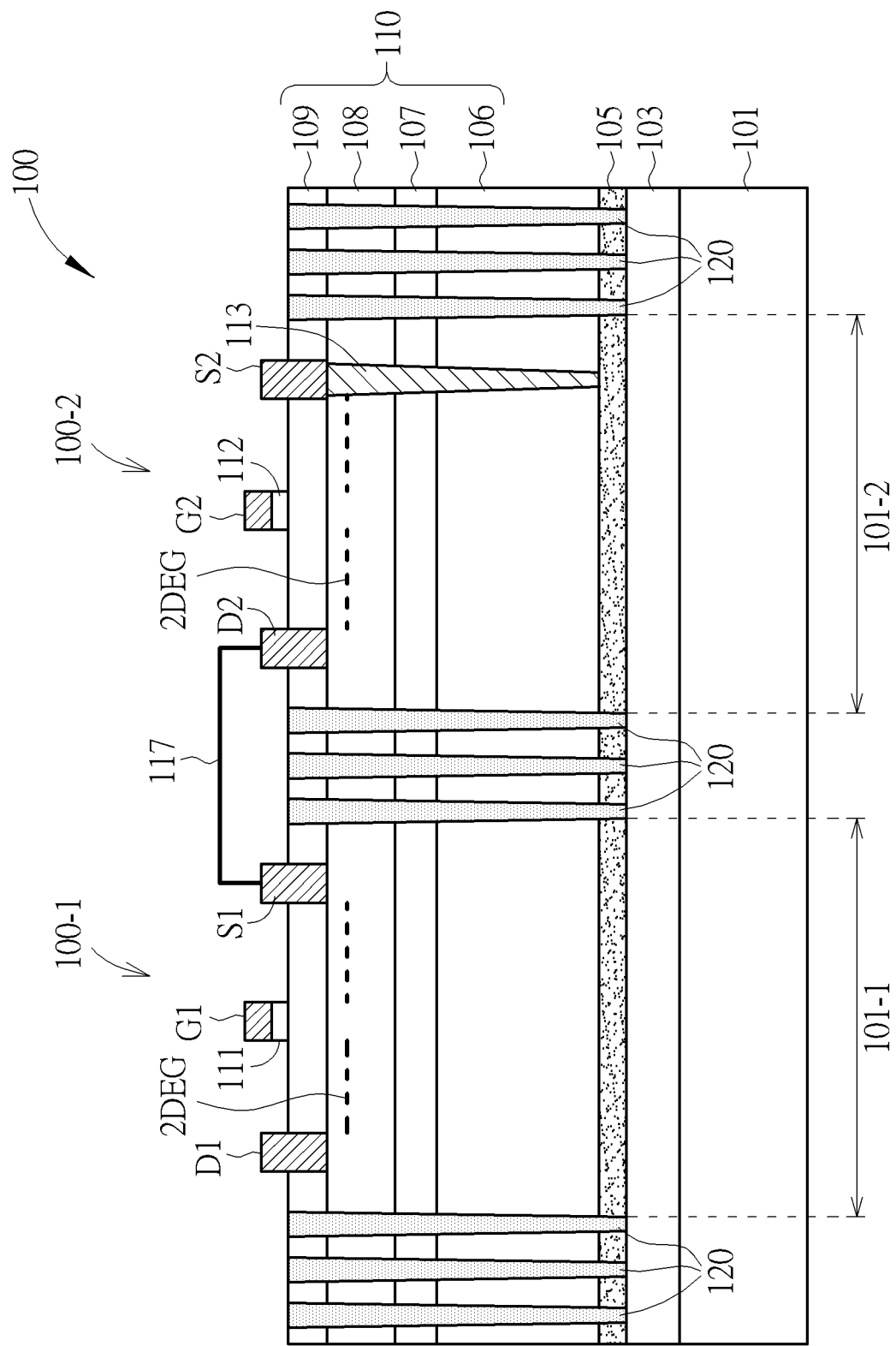
FIG. 4 is a schematic cross-sectional view of a semiconductor device according to another embodiment of the present disclosure.

FIG. 4 is a schematic cross-sectional view of a semiconductor device according to another embodiment of the present disclosure. The difference between the semiconductor device 100 of FIG. 4 and the semiconductor device 100 of FIG. 1 is that in the semiconductor device 100 of FIG. 4, the first source electrode S1 and the first drain electrode D1 of the first transistor 100-1, and the second source electrode S2 and the second drain electrode D2 of the second transistor 100-2 all extend downward to pass through the barrier layer 109 to reach the top surface of the channel layer 108. Moreover, in the semiconductor device 100 of FIG. 4, the conductive structure 113 in the second device region 101-2 is disposed directly under the second source electrode S2, passes through the entire channel layer 108, the high resistance layer 107 and the buffer layer 106, but does not pass through the barrier layer 109. In another embodiment, the first source electrode S1, the first drain electrode D1, the second source electrode S2 and the second drain electrode D2 may further extend downward to a position in the depth of the channel layer 108. Moreover, the conductive structure 113 in contact with the second source electrode S2 may pass through a portion of the channel layer 108, the high resistance layer 107 and the buffer layer 106.

In addition, in the semiconductor device 100 of FIG. 4, the isolation structure 120 passes through the compound semiconductor stacked layer 110 and the semiconductor layer 105 to reach the top surface of the insulating layer 103, i.e., the bottom surface of the isolation structure 120 and the top surface of the insulating layer 103 are on the same plane. In some embodiments, the substrate 101 is an insulating substrate, and its material includes ceramic, aluminum nitride or sapphire. In other embodiments, the substrate 101 is electrically connected to the ground terminal. Moreover, in the semiconductor device 100 of FIG. 4, the semiconductor layer 105 in the first device region 101-1 may be an electrically floating layer, i.e., the semiconductor layer 105 in the first device region 101-1 is not electrically connected to the ground terminal through the another conductive structure 115 as shown in FIG. 1, and the semiconductor layer 105 in the first device region 101-1 has a floating potential close to 0V. Since the substrate 101 has a ground potential or is an insulating substrate, there is no parasitic capacitance generated between the semiconductor layer 105 in the first device region 101-1 and the substrate 101.

Figure 5:
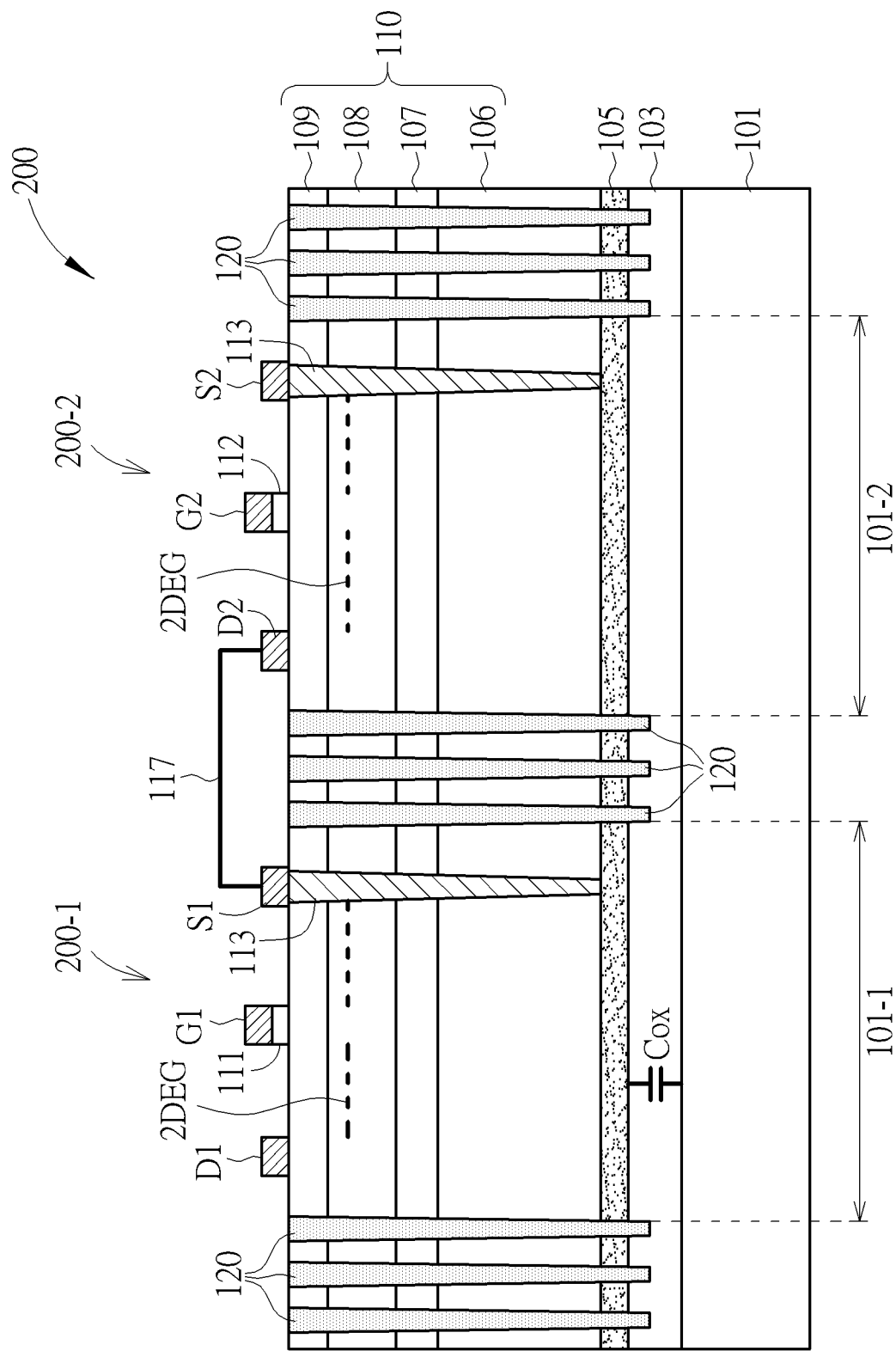
FIG. 5 is a schematic cross-sectional view of a semiconductor device according to further another embodiment of the present disclosure.
Figure 6:
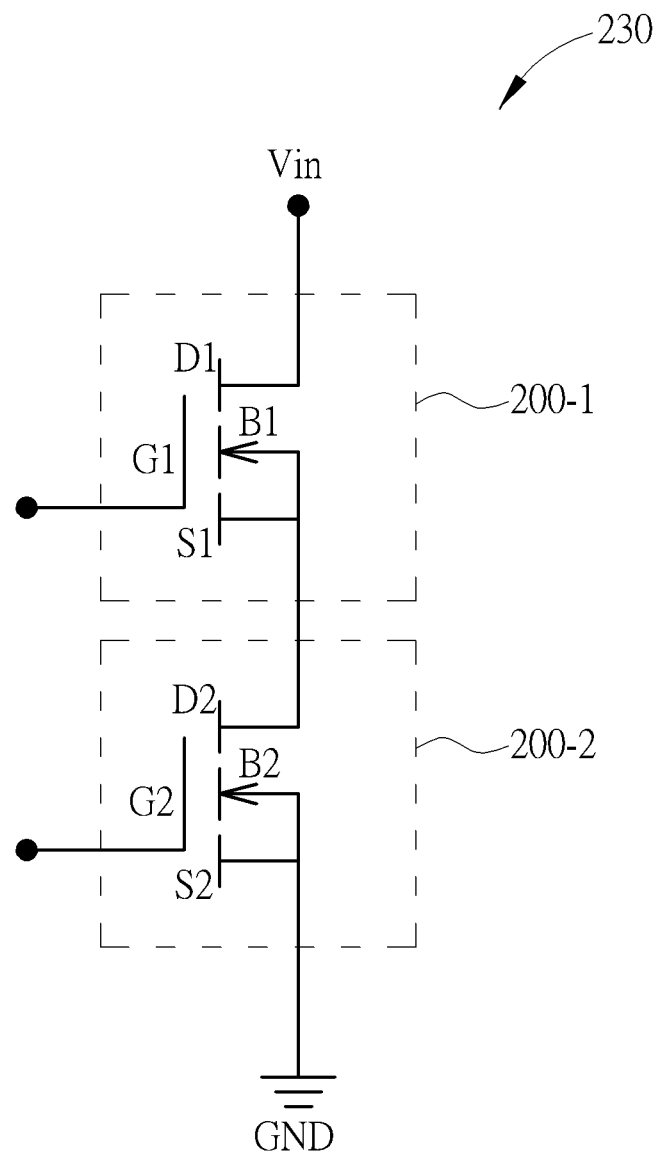
FIG. 6 is a half-bridge circuit according to another embodiment of the present disclosure.

FIG. 5 is a schematic cross-sectional view of a semiconductor device according to another embodiment of the present disclosure. As shown in FIG. 5, the difference between a semiconductor device 200 of this embodiment and the semiconductor devices 100 of FIG. 1 and FIG. 4 is that the first source electrode S1 of a first transistor 200-1 for a high-side switching element is electrically connected to the semiconductor layer 105 in the first device region 101-1 through a conductive structure 113. FIG. 6 shows a half-bridge circuit 230 according to another embodiment of the present disclosure. Please refer to FIG. 5 and FIG. 6 together, the semiconductor layer 105 in the first device region 101-1 of the semiconductor device 200, i.e., the backside electrode B1 of the first transistor 200-1, is electrically connected to the first source electrode S1, the first source electrode S1 is electrically connected to the second drain electrode D2, and the first source electrode S1 is further electrically connected to the node of an output voltage (not shown). Therefore, the semiconductor layer 105 in the first device region 101-1 of the semiconductor device 200 of this embodiment has a floating potential of 0V to the output voltage, resulting in a parasitic capacitance Cox generated between the semiconductor layer 105 in the first device region 101-1 and the substrate 101 of the semiconductor device 200, which affects the input/output voltage of the semiconductor device 200, and the power supply of the semiconductor device 200 may not be maintained in a normal operating voltage.

In addition, the parasitic capacitance Cox of the semiconductor device 200 of this embodiment is affected by the thickness of the insulating layer 103. In order to reduce the parasitic capacitance Cox, the thickness of the insulating layer 103 of the semiconductor device 200 must be increased. However, while the thickness of the insulating layer 103 is increased, the heat dissipation capability of the semiconductor device 200 will also become worse, thereby reducing the performance of the semiconductor device 200.

In contrast, for the semiconductor devices 100 illustrated in FIG. 1 to FIG. 4, the semiconductor layer 105 in the first device region 101-1 of the semiconductor devices 100 according to the embodiments of the present disclosure, i.e., the backside electrode B1 of the first transistor 100-1 of the high-side switching element, is electrically connected to the ground node, or is an electrically floating layer with an electrical potential close to 0V, so that there is no parasitic capacitance generated between the semiconductor layer 105 in the first device region 101-1 and the substrate 101, and the thickness of the insulating layer 103 will not be limited, i.e., the thickness of the insulating layer 103 may be relatively thin to maintain the heat dissipation capability of the semiconductor devices 100. In addition, according to some embodiments of the present disclosure, the substrate 101 is an electrically insulating and thermally conductive substrate, such as made of aluminum nitride (AlN) with highly insulating and highly thermally conductive properties, so that the thermal conductivity of the substrate 101 is higher than that of the insulating layer 103. The substrate 101 may not only increase the heat dissipation capability of the semiconductor devices 100, but also increase the entire thickness of the overall insulator leading to the parasitic capacitance (i.e., the thickness of the insulating layer 103 plus the thickness of the substrate 101), thereby greatly reducing the parasitic capacitance of the semiconductor devices 100. The parasitic capacitance may be substantially eliminated and ignored in the semiconductor devices of the present disclosure, so that it avoids the restriction on the power supply voltage (Vbus) of the semiconductor devices caused by the actual thickness of the insulating layer (the thickness in the vertical direction) under the backside electrode of the semiconductor devices 100.

Therefore, the semiconductor devices of the embodiments of the present disclosure use HEMTs as the high-side switching element and the low-side switching element of the half-bridge circuit to achieve the benefits of a system-on-a-chip (SoC), and avoid parasitic inductance and capacitance effects between the high-side and low-side switching elements caused by wire bonding. Meanwhile, the parasitic capacitance between the backside electrode of the high-side switching element and the substrate is eliminated, and the limitation of the thickness of the insulating layer under the backside electrode to the power supply voltage (Vbus) of the semiconductor devices is also avoided, thereby maintaining the heat dissipation capability of the semiconductor devices, and improving the performance of the semiconductor devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   an insulating layer, a semiconductor layer and a compound semiconductor stacked layer, disposed on a substrate in sequence;
   a first transistor, disposed in a first device region, and comprising a first gate electrode, a first source electrode and a first drain electrode disposed on the compound semiconductor stacked layer;
   a second transistor, disposed in a second device region and comprising a second gate electrode, a second source electrode and a second drain electrode disposed on the compound semiconductor stacked layer;
   an isolation structure, disposed between the first transistor and the second transistor; and
   a conductive structure, disposed in the second device region, passing through the compound semiconductor stacked layer, and electrically connecting the semiconductor layer to the second source electrode,
   wherein there is no electrical connection between the semiconductor layer in the first device region and the first source electrode, the first source electrode is electrically connected to the second drain electrode, and the semiconductor layer in the first device region is an electrically floating layer, or is configured to be electrically connected to a ground node.

2. The semiconductor device of claim 1, wherein the semiconductor layer in the first device region is configured to be connected to a ground voltage through a seal ring.

3. The semiconductor device of claim 2, further comprising another conductive structure disposed in the first device region and passing through the compound semiconductor stacked layer, wherein the another conductive structure electrically connects the seal ring to the semiconductor layer.

4. The semiconductor device of claim 3, wherein the another conductive structure is disposed outside vertical projection areas of the first gate electrode, the first source electrode and the first drain electrode of the first transistor.

5. The semiconductor device of claim 1, wherein the first transistor and the second transistor include high electron mobility transistors, the first transistor is a high voltage switching element of a half-bridge circuit, and the second transistor is a low voltage switching element of the half-bridge circuit.

6. The semiconductor device of claim 1, wherein the semiconductor layer in the first device region and the second source electrode are configured to be connected to the ground node.

7. The semiconductor device of claim 1, wherein the substrate is configured to be connected to a ground voltage.

8. The semiconductor device of claim 1, wherein the substrate, the insulating layer and the semiconductor layer constitute a semiconductor-on-insulator (SOI) substrate.

9. The semiconductor device of claim 1, wherein the substrate is an insulating substrate.

10. The semiconductor device of claim 1, wherein the semiconductor layer is a nucleation layer.

11. The semiconductor device of claim 1, wherein a thickness of the semiconductor layer is in a range of 5 nm to 350 nm.

12. The semiconductor device of claim 1, wherein a thickness of the insulating layer is in a range of 1 µm to 3 µm.

13. The semiconductor device of claim 1, wherein the substrate comprises ceramic, silicon carbide, aluminum nitride, sapphire or silicon, the insulating layer comprises silicon oxide, silicon nitride, silicon oxynitride or a combination thereof, and the semiconductor layer comprises silicon or polysilicon.

14. The semiconductor device of claim 1, wherein the compound semiconductor stacked layer comprises a buffer layer, a high resistance layer, a channel layer and a barrier layer disposed on the semiconductor layer in sequence, and the material of the compound semiconductor stacked layer comprises group III-V compound semiconductors.

15. The semiconductor device of claim 14, wherein the first source electrode, the first drain electrode, the second source electrode and the second drain electrode are disposed on the barrier layer, or pass through the barrier layer to the channel layer.

16. The semiconductor device of claim 14, further comprising a first cap layer disposed between the first gate electrode and the barrier layer, and a second cap layer disposed between the second gate electrode and the barrier layer.

17. The semiconductor device of claim 1, wherein the isolation structure passes through the compound semiconductor stacked layer and the semiconductor layer, and a bottom surface of the isolation structure is lower than a top surface of the insulating layer, or a bottom surface of the isolation structure and a top surface of the insulating layer are on the same plane.

18. The semiconductor device of claim 1, wherein the isolation structure is an insulating pillar structure, passing through the compound semiconductor stacked layer and the semiconductor layer and surrounding the first transistor and the second transistor.

19. The semiconductor device of claim 18, further comprising another conductive structure disposed in the first device region and passing through the compound semiconductor stacked layer, wherein the insulating pillar structure surrounds the another conductive structure, the another conductive structure is configured to be connected to a ground voltage, and the another conductive structure is not electrically connected to the first source electrode.

* * * * *